(12) United States Patent
Oh

(10) Patent No.: US 6,429,055 B2
(45) Date of Patent: Aug. 6, 2002

(54) METHOD FOR MAKING SOI MOSFETS

(75) Inventor: Jeong Hee Oh, Seoul (KR)

(73) Assignee: Hynix Semiconductor Inc., Ich'on (KR)

( * ) Notice: Subject to any disclaimer, the term of this patent is extended or adjusted under 35 U.S.C. 154(b) by 0 days.

(21) Appl. No.: 09/891,193

(22) Filed: Jun. 26, 2001

(30) Foreign Application Priority Data

Jun. 30, 2000 (KR) .............................................. 00-37414

(51) Int. Cl.[7] .............................................. H01L 21/00
(52) U.S. Cl. ...................... 438/149; 438/163; 438/303; 438/589
(58) Field of Search ................................ 438/149, 163, 438/151, 270, 303, 589

(56) References Cited

U.S. PATENT DOCUMENTS 5,956,580 A * 9/1999 Wu ............................. 438/163

FOREIGN PATENT DOCUMENTS

EP 880169 * 11/1998
EP 902482 * 3/1999

* cited by examiner

Primary Examiner—Trung Dang
(74) Attorney, Agent, or Firm—Finnegan, Henderson, Farabow, Garrett & Dunner, L.L.P.

(57) ABSTRACT

Disclosed is a method for making an SOI MOSFET, which is capable of improving threshold voltage variations and a parasitic bipolar effect generated in the formation of fully depleted (FD) SOI semiconductor integrated circuits using a recess channel. The method involves the steps of forming a buried oxide film and an active silicon film over a silicon-on-insulator substrate, forming a channel at a recess channel, forming dummy spacers at opposite side walls of the etched active silicon film, forming a gate between the dummy spacers, forming a photoresist film on the gate and the active silicon film, forming lightly doped drain regions, removing the dummy spacers, forming lightly doped ion regions, respectively, forming spacers at opposite side walls of the recess channel region, respectively, removing the photoresist film, forming a source region and a drain region, forming source/drain electrodes and a gate electrode on the resultant structure.

28 Claims, 4 Drawing Sheets

METHOD FOR MAKING SOI MOSFETS

BACKGROUND OF THE INVENTION

1. Field of the Invention

The present invention relates to a method for making a silicon-on-insulator (SOI) metal oxide silicon field effect transistor (MOSFET), and a method for making SOI MOSFETs capable of improving variations in threshold voltage and a parasitic bipolar effect generated in the formation of fully depleted (FD) SOI semiconductor integrated circuits using a recess channel.

2. Description of the Related Art

FD SOI MOSFET devices have superior characteristics such as an ideal subthreshold slope, perfect isolation, no parasitic capacitance and no floating body effect. However, in such FD SOI MOSFET devices, it is difficult to maintain desired threshold characteristics in the formation of channels. The difficulty is largely based on the insufficient thickness of an SOI film and a severe variation in the thickness of the SOI film. Another problem with these types of FD SOI MOSFET devices is an increase in resistance during the formation of source/drain regions due to the insufficient thickness of the SOI film.

In order to solve the problems associated with conventional FD SOI MOSFET devices, a method has been proposed which uses a recess channel. In accordance with this method, an oxide film is formed to a desired thickness following the formation of a structure consisting of an oxide film and a nitride film arranged at a region other than a channel. The oxide film is then removed. This method is known as a local oxidation of silicon (LOCOS) method. However, the LOCOS method involves the formation of bird's beaks. When a gate is formed at a region where a bird's beak is formed, a variation in the thickness of the oxide occurs. As a result, the layout of transistors is limited by their width and length.

Although the conventional method of making FD SOI MOSFETs using a recess channel provides an improvement in source/drain resistance, the thickness of the gate oxide film at the channel region may vary due to the presence of birds beaks.

In order to apply the conventional method of making FD SOI MOSFETs using a recess channel to the fabrication of ultra-micro devices, the method should be configured to adjust a variation in the thickness of a thin SOI film. In particular, the thickness of channel edge portions should be adjusted.

In the conventional FD SOl MOSFET making method, the ion implant conducted for the SOI film should be carried out at a very low ion energy in order to obtain a desired threshold voltage. This is because the SOI film is thin. Furthermore, a desired channel profile should be maintained during the ion implant because the ion implant may affect the produced FD SOI MOSFET.

FD SOI MOSFETs also do not have a lightly doped drain (LDD) region to accomplish high integration. When an FD SOI MOSFET is fabricated using a recess channel structure, it may have an LDD region with a limited width depending on the structure of the FD SOI MOSFET. The width is limited because the region, where a recess is to be formed, has a width corresponding to the sum of the channel width and two times a spacer width.

In the case of FD SOI MOSFETs having no LDD regions or a reduced LDD width, a parasitic bipolar effect may occur. For this reason, FD SOI MOSFET making methods using a recess channel should be configured to improve the parasitic bipolar effect. Therefore, in accordance with conventional FD SOI MOSFET making methods using a recess channel, germanium (Ge) ions are implanted in source/drain regions. Alternatively, argon (Ar) ions are implanted at a tilt angle of 45° or more after the removal of spacers.

The ion implant conducted in the above mentioned conventional FD SOI MOSFET making methods using a recess channel is the easiest method capable of achieving an improvement in working voltage. However, germanium (Ge) ions should be implanted in source/drain regions in a high concentration of 10% or more. Otherwise, a tilt implant should be carried out at a sharp angle after removal of the spacers. For this reason, a degradation in reproducibility occurs. Furthermore, ions may be implanted even in a region not to be implanted with ions. Consequently, the device produced has a structure in which degradation in thermal carriers easily occurs.

SUMMARY OF THE INVENTION

Therefore, the present invention has been made in view of the above mentioned problems. A feature of the present invention is to provide an SOI MOSFET making method capable of improving a variation in threshold voltage and a parasitic bipolar effect generated in the formation of FD SOI semiconductor integrated circuits using a recess channel.

In accordance with one aspect, the present invention provides a method for making a silicon-on-insulator metal oxide silicon field effect transistor comprising the steps of: sequentially forming a buried oxide film and an active silicon film over a silicon-on-insulator substrate; forming a first photoresist film on the active silicon film; implanting ions in a portion of the active silicon film exposed after the formation of the first photoresist film, thereby forming a recess channel region; etching the active silicon film to a desired depth while using the first photoresist film as a mask, thereby forming a channel at the recess channel region; forming dummy spacers at opposite side walls of the etched active silicon film, respectively; forming a gate on the recess channel region between the dummy spacers; removing the first photoresist film, and forming a second photoresist film on a portion of the active silicon film exposed after the removal of the first photoresist film, and on the gate, except for regions where the dummy spacers are formed, respectively; implanting ions in portions of the recess channel region each defined between the gate and an associated one of the dummy spacers, thereby forming lightly doped drain regions, respectively; removing the dummy spacers, and implanting low-concentration impurity ions in portions of the recess channel region defined at opposite sides of the gate, thereby forming lightly doped ion regions, respectively; forming spacers at opposite side walls of the recess channel region, respectively; removing the second photoresist film, and implanting high-concentration impurity ions in the active silicon film, thereby forming a source region and a drain region; and forming source/drain electrodes and a gate electrode on a structure obtained after the formation of the source and drain regions, in accordance with a metal line process.

The method further comprises the step of forming a suicide film on the source and drain regions.

In accordance with another aspect, the present invention provides a method for making a silicon-on-insulator metal oxide silicon field effect transistor comprising the steps of: sequentially forming a buried oxide film and an active silicon film over a silicon-on-insulator substrate; forming a first photoresist film on the active silicon film; implanting ions in a portion of the active silicon film exposed after the formation of the first photoresist film, thereby forming a recess channel region; etching the active silicon film to a desired depth while using the first photoresist film as a mask, thereby forming a channel at the recess channel region; forming dummy spacers at opposite side walls of the etched active silicon film, respectively; forming a gate on the recess channel region between the dummy spacers; removing the first photoresist film, and forming a second photoresist film on a portion of the active silicon film exposed after the removal of the first photoresist film, and on the gate, except for regions where the dummy spacers are formed, respectively; implanting ions in portions of the recess channel region each defined between the gate and an associated one of the dummy spacers, thereby forming lightly doped drain regions, respectively, while implanting low-concentration impurity ions in portions of the recess channel region defined at opposite sides of the gate, thereby forming lightly doped ion regions, respectively; forming spacers on the dummy spacers, respectively; removing the second photoresist film, and implanting high-concentration impurity ions in the active silicon film, thereby forming a source region and a drain region; and forming source/drain electrodes and a gate electrode on a structure obtained after the formation of the source and drain regions, in accordance with a metal line process.

BRIEF DESCRIPTION OF THE DRAWINGS

Various embodiments, features and advantages of the present invention will become more apparent after a reading of the following detailed description when taken in conjunction with the drawings, in which.

DESCRIPTION OF THE PREFERRED EMBODIMENTS

Now, preferred embodiments of the present invention will be described in conjunction with the annexed drawings.

FIGS. 1A to 1F are cross-sectional views respectively illustrating sequential processing steps of a method for making an SOI MOSFET in accordance with an embodiment of the present invention.

Figure 1A:
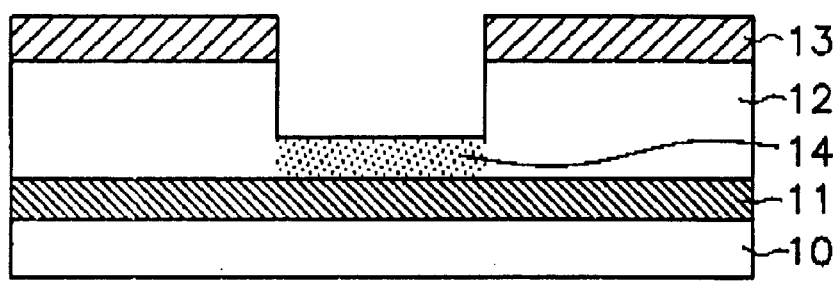
FIGS. 1A, 1B, 1C, 1D, 1E and 1F are cross-sectional views respectively illustrating sequential processing steps of a method for making an SOI MOSFET in accordance with an embodiment of the present invention.

In accordance with the illustrated method, a buried oxide film 11 and an active silicon film 12 are sequentially formed over an SOI substrate 10, as shown in FIG. 1A. A photoresist pattern 13 is formed on the active silicon film 12 in order to form a channel for a MOSFET to be formed on the active silicon film 12. An ion implant is conducted for a portion of the active silicon film 12 exposed after the formation of the photoresist pattern 13.

Using the photoresist pattern 13 as a mask, the active silicon film 12 is etched to a desired depth, as shown in FIG. 1A. The etch depth of the active silicon film 12 is determined so that the thickness of a channel defined between the bottom of the etched portion of the active silicon film 12 and the upper surface of the buried oxide film 11 is less than the thickness of a source/drain region to be subsequently formed.

Thereafter, a recess channel region for the MOSFET is formed. In FIG. 1A, the recess channel region is denoted by the reference numeral 14. In the formation of the MOSFET channel, an ion implant is first conducted in such a fashion that the projected range of ions "Rp" corresponds to half the final channel thickness. The recess channel region 14 is then removed by a thickness of 50 Å or more, using a silicon etching process. This silicon etching process is carried out by dry etching the recess channel region 14 using a photoresist mask. The dry etching process is performed such that edge surfaces of the recess channel region 14 each have an angle of 80° or more. Also, the recess channel region 14 is formed to have opposite lateral end portions with the same topology as those of source and drain regions to be subsequently formed, respectively.

Figure 1B:
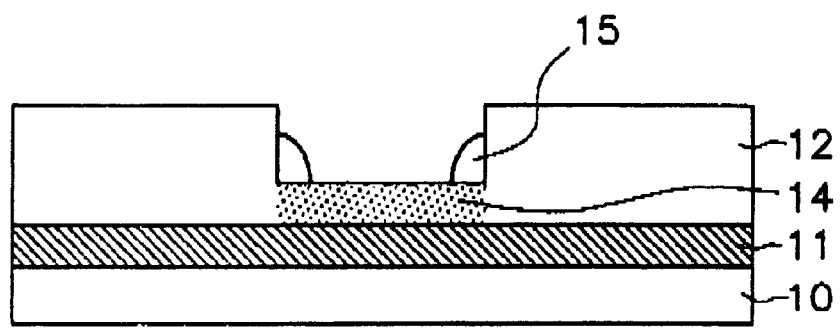

Dummy spacers 15 made of a nitride film are then formed at respective side walls of the active silicon film 12 (FIG. 1B). The dummy spacers 15 are formed to have a thickness of 100 Å while having the form of a spacer. The formation of the dummy spacers 15 is carried out using a sacrificial nitride film process.

Figure 1C:
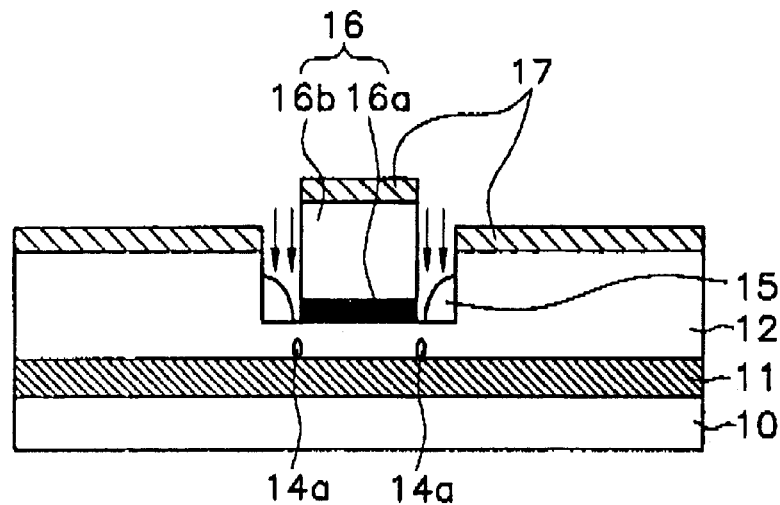

Thereafter, a gate oxide film 16a and a polysilicon film 16b are sequentially formed on the recess channel 14 between the dummy spacers 15 using a well-known method (FIG. 1C). Using a gate mask process, a gate region is then defined in the resulting structure obtained after the formation of the polysilicon film 16b. Subsequently, the polysilicon film 16b and gate oxide film 16a are etched at the gate region to form a gate 16 (FIG. 1C).

As shown in FIG. 1C, a photoresist film 17 is then formed on the active silicon film 12 and the gate 16. However, photoresist film 17 is not formed on the regions where the dummy spacers 15 are formed.

Thereafter, impurity ions are implanted in portions of the recess channel region 14 defined between respective dummy spacers 15 and the gate 16 (FIG. 1C). The implanted ions may include ions of Group 4b, such as silicon ions ($Si^+$) or germanium ions ($Ge^+$), and ions of inert gas, such as nitrogen ($N^+$) or argon ($Ar^+$). In accordance with the ion implant, recombination centers 14a are formed at regions where the channel is joined to the source and drain, respectively. By virtue of the recombination centers 14a, an improvement in parasitic bipolar effect is obtained.

Figure 1D:
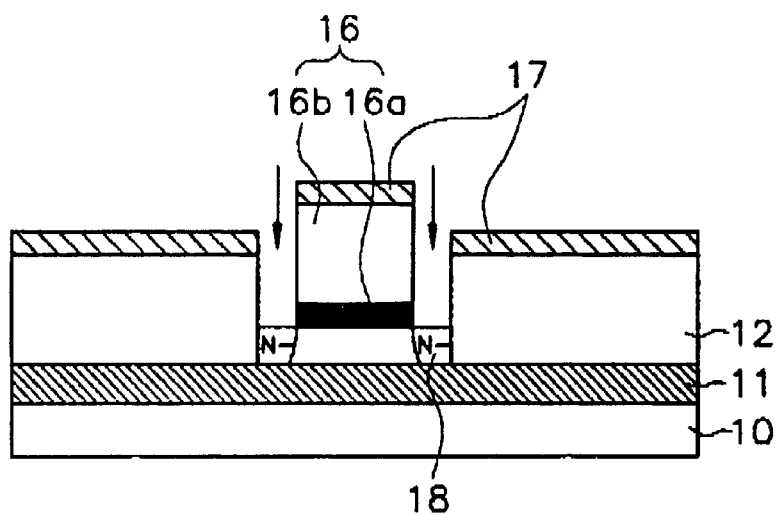
Figure 1E:
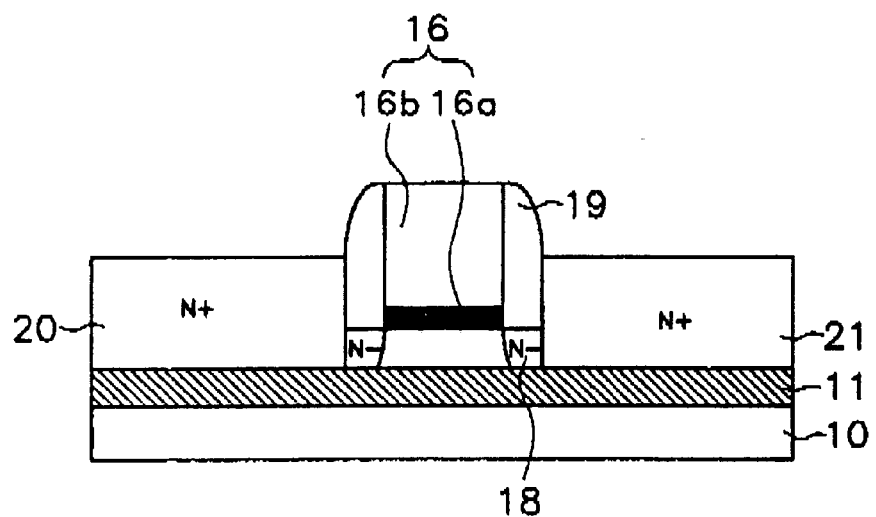

The dummy spacers 15 are then completely removed. Impurity ions of a low concentration, for example, $N^-$, are implanted to form lightly doped ion regions 18 (FIG. 1D). Subsequently, spacers 19 are formed at opposite sides of the recess channel region 14, respectively (FIG. 1E). The spacers 19 are arranged at dummy spacer regions corresponding to the removed dummy spacers 15, respectively. The spacers 19 are formed to have a thickness of 100 Å using a nitride film. In place of the nitride film, an oxide film may be used to form the spacers 19. In the event an oxide film is used, the spacers 19 are formed to have a thickness of 300 Å or more.

After removal of the photoresist film 17, impurity ions of a high concentration, for example, $N^+$, are implanted in the active silicon film 12, thereby forming a source region 20 and drain region 21 (FIG. 1E). The source region 20 and drain region 21 may be formed to have a level difference of 50 Å or more from the recess channel region 14.

Figure 1F:
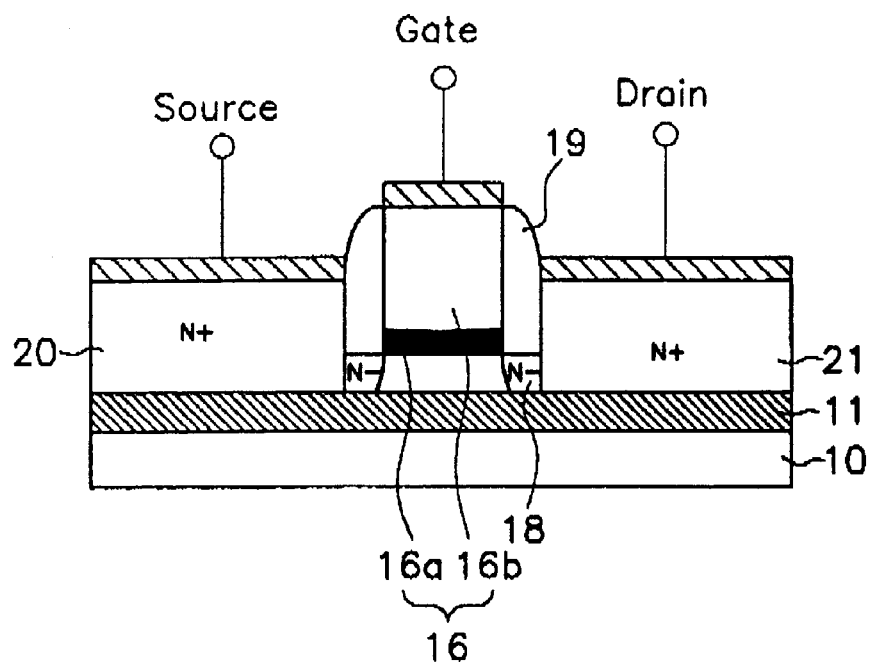

Thereafter, formation of source/drain electrodes and a gate electrode are carried out using a well-known metal line process (FIG. 1F). Thus, production of an FD SOI MOSFET using the recess channel region 14 is completed.

Figure 2:
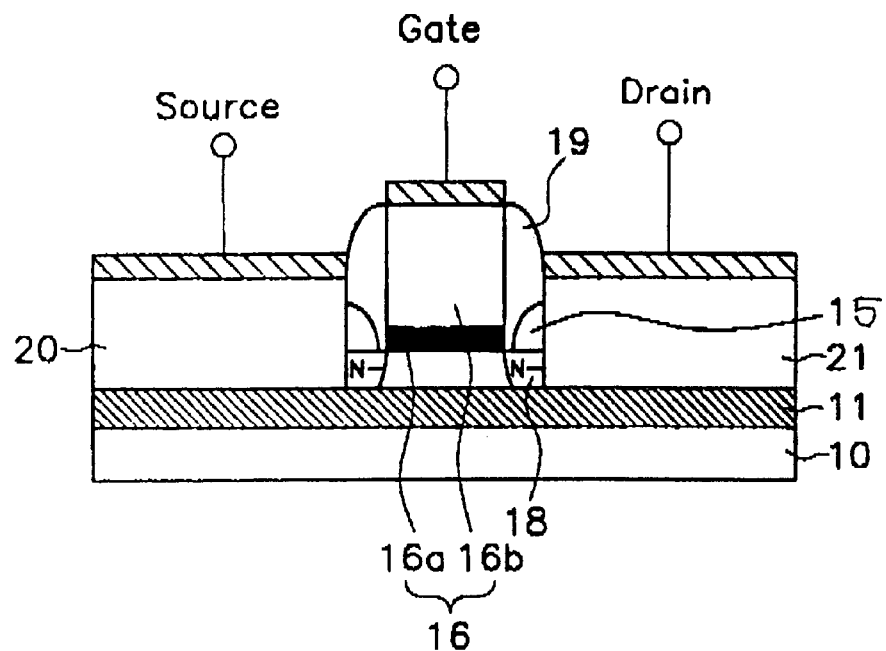
FIG. 2 is a cross-sectional view illustrating an SOI MOSFET making method according to another embodiment of the present invention.

FIG. 2 is a cross-sectional view illustrating an SOI MOSFET making method according to another embodiment of the present invention.

In accordance with the method illustrated in FIG. 2, the process of implanting impurity ions by using the dummy spacers 15 as described in FIGS. 1C and 1D is modified. Particularly, the ion implant for suppressing parasitic bipolar effects and the implant of low-concentration impurity ions are simultaneously carried out using the dummy spacers 15 as a mask.

In the method of FIG. 2, the dummy spacers 15 are not removed, contrary to the processing step of FIG. 1D. That is, a nitride film or oxide film is formed to a desired thickness on the dummy spacers 15. The nitride film or oxide film is then etched to form spacers 19 having the same structure as that of the spacers shown in FIG. 1E. Thus, production of an FD SOI MOSFET using the recess channel region 14 is completed.

Figure 3:
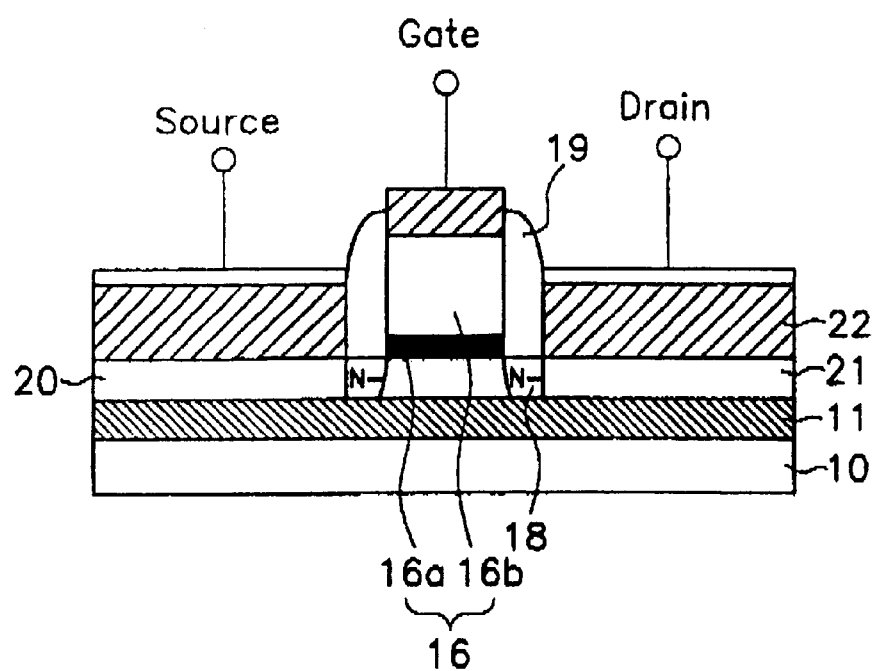
FIG. 3 is a cross-sectional view illustrating an SOI MOSFET making method according to another embodiment of the present invention.

FIG. 3 is a cross-sectional view illustrating an SOI MOSFET making method according to another embodiment of the present invention.

In accordance with the method illustrated in FIG. 3, a desired SOI MOSFET is made by forming a silicide film 22 on the source region 20 and drain region 21. This structure is used to prevent the entire portion of the source region 20 and drain region 21 from being formed into a silicide.

In accordance with the method of FIG. 3, a cobalt suicide film is deposited on portions of the SOI substrate 10 respectively corresponding to the source region 20 and drain region 21. The cobalt silicide film is then subjected to a thermal treatment so as to allow silicon (Si) and cobalt (Co) to react with each other. In accordance with this reaction, a silicide film 22 is formed on the source region 20 and drain region 21. After the formation of the silicide film 22, the cobalt silicide film is removed.

As apparent from the above description, the present invention provides an SOI MOSFET making method capable of improving a variation in threshold voltage and a parasitic bipolar effect generated in the formation of an ultra-micro FD SOI MOSFET device using a recess channel.

In order to obtain an improved recess channel structure in the formation of an FD SOI in accordance with the SOI MOSFET making method of the present invention, the formation of a recess channel is conducted using a silicon etching process, not a LOCOS process. In order to maintain a desired channel profile, thereby reducing threshold voltage variations, the thickness of the SOI is adjusted after an adjustment for providing a smooth channel profile. In accordance with this method, forming source and drain regions with a desired thickness improve the source/drain resistance. Furthermore, the channel has a smooth doping profile while being fully depleted. Additionally, any one of known SOI isolation methods may be used in the SOI MOSFET structure.

In accordance with the present invention, improvement may be achieved in the PBE of a highly integrated FD SOI device, where it is impossible to obtain LDD regions of a sufficient area. In order to obtain this improvement, dummy spacers are used as a mask. Also, an ion implant involving no tilt is conducted, thereby providing a desired resistance at thin and narrow LDD regions. The methods of the present invention may be flexibly applied using a variety of spacers in the FD SOI device. In particular, the methods of the present invention can be efficiently used where the channel has a small thickness. The methods of the present invention enables the manufacture of large scale integrations in systems using SOI devices or memories using known LSI processes. Accordingly, the methods of the present invention provide an improved utility in a variety of industrial fields.

What is claimed is:

1. A method for making a silicon-on-insulator metal oxide silicon field effect transistor comprising the steps of:
    sequentially forming a buried oxide film and an active silicon film over a silicon-on-insulator substrate;
    forming a first photoresist film on the active silicon film;
    forming a recess channel region by implanting ions in a portion of the active silicon film exposed after the formation of the first photoresist film;
    forming a channel at the recess channel region by etching the active silicon film to a predetermined depth while using the first photoresist film as a mask;
    forming dummy spacers at opposite side walls of the etched active silicon film, respectively;
    forming a gate on the recess channel region between the dummy spacers;
    removing the first photoresist film, and forming a second photoresist film on a portion of the active silicon film exposed after the removal of the first photoresist film, and on the gate, wherein the second photoresist film is not formed on regions where the dummy spacers are formed;
    forming lightly doped drain regions by implanting ions in portions of the recess channel region, each portion defined between the gate and an associated one of the dummy spacers;
    forming lightly doped ion regions by removing the dummy spacers and implanting low-concentration impurity ions in portions of the recess channel region defined at opposite sides of the gate;
    forming spacers at opposite side walls of the recess channel region;
    removing the second photoresist film, and implanting high-concentration impurity ions in the active silicon film, thereby forming a source region and a drain region; and
    forming source/drain electrodes and a gate electrode on a structure obtained after the formation of the source and drain regions.

2. The method according to claim 1, wherein the step of etching the active silicon film is carried out such that the channel has a thickness defined between an etched bottom of the active silicon film and an upper surface of the buried oxide film and wherein the channel's thickness is less than each thickness of the source and drain regions.

3. The method according to claim 1, wherein the step of forming the recess channel region is carried out to allow a projected range of ions to correspond to half the thickness of the channel, and a selected portion of the recess channel is removed when the active silicon film is etched, wherein the selected portion has a thickness of 50 Å or more.

4. The method according to claim 3, wherein the step of etching the active silicon film is carried out using a dry etch process and wherein edge surfaces of the recess channel region are etched to have an angle of 80° or more.

5. The method according to claim 1, wherein opposite lateral ends of the recess channel region have the same topology as the source and drain regions.

6. The method according to claim 1, wherein the dummy spacers are made of a nitride film.

7. The method according to claim 1, wherein the dummy spacers are formed in accordance with a sacrificial nitride film process and have a thickness of 100 Å or more.

8. The method according to claim 1, wherein the step of forming the gate comprises the steps of:
   sequentially forming a gate oxide film and a polysilicon film on the recess channel region; and
   etching the polysilicon film and the gate oxide film in accordance with a gate mask process.

9. The method according to claim 1, wherein the ions implanted in the lightly doped drain regions are ions selected from a group consisting of silicon ions ($Si^+$) and germanium ions ($Ge^+$).

10. The method according to claim 1, wherein the ions implanted when forming the lightly doped drain regions are inert gas ions selected from a group consisting of nitrogen ions ($N^+$) and argon ions ($Ar^+$).

11. The method according to claim 1, wherein the spacers are made of a nitride film and have a thickness of 100 Å or more.

12. The method according to claim 1, wherein the spacers are made of an oxide film and have a thickness of 300 Å or more.

13. The method according to claim 1, wherein the source and drain regions each have a thickness difference of 50 Å or more from the recess channel region.

14. The method according to claim 1, further comprising the step of:
   forming a silicide film on the source and drain regions.

15. A method for making a silicon-on-insulator metal oxide silicon field effect transistor comprising the steps of:
   sequentially forming a buried oxide film and an active silicon film over a silicon-on-insulator substrate;
   forming a first photoresist film on the active silicon film;
   forming a recess channel region by implanting ions in a portion of the active silicon film exposed after the formation of the first photoresist film;
   forming a channel at the recess channel region by etching the active silicon film to a predetermined depth while using the first photoresist film as a mask;
   forming dummy spacers at opposite side walls of the etched active silicon film;
   forming a gate on the recess channel region between the dummy spacers;
   removing the first photoresist film, and forming a second photoresist film on a portion of the active silicon film exposed after the removal of the first photoresist film and on the gate, wherein the second photoresist film is not formed on regions where the dummy spacers are formed;
   forming lightly doped drain regions by implanting ions in portions of the recess channel region, each portion defined between the gate and an associated one of the dummy spacers, respectively, while forming lightly doped ion regions by implanting low-concentration impurity ions in portions of the recess channel region defined at opposite sides of the gate;
   forming spacers on the dummy spacers;
   removing the second photoresist film, and implanting high-concentration impurity ions in the active silicon film, thereby forming a source region and a drain region; and
   forming source/drain electrodes and a gate electrode on a structure obtained after the formation of the source and drain regions.

16. The method according to claim 15, wherein the step of etching the active silicon film is carried out such that the channel has a thickness defined between an etched bottom of the active silicon film and an upper surface of the buried oxide film, wherein the channel's thickness is less than each thickness of the source and drain regions.

17. The method according to claim 15, wherein the step of forming the recess channel region is carried out to allow a projected range of ions to correspond to half the thickness of the channel, and a selected portion of the recess channel is removed when the active silicon film is etched, wherein the selected portion has a thickness of 50 Å or more.

18. The method according to claim 17, wherein the step of etching the active silicon film is carried out using a dry etch process, and wherein edge surfaces of the recess channel region are etched to have an angle of 80° or more.

19. The method according to claim 15, wherein opposite lateral ends of the recess channel region have the same topology as the source and drain regions.

20. The method according to claim 15, wherein the dummy spacers are made of a nitride film.

21. The method according to claim 15, wherein the dummy spacers are formed in accordance with a sacrificial nitride film process and have a thickness of 100 Å or more.

22. The method according to claim 15, wherein the step of forming the gate comprises the steps of:
   sequentially forming a gate oxide film and a polysilicon film on the recess channel region; and
   etching the polysilicon film and the gate oxide film in accordance with a gate mask process.

23. The method according to claim 15, wherein the ions implanted in the lightly doped drain regions are ions selected from a group consisting of silicon ions ($Si^+$) and germanium ions ($Ge^+$).

24. The method according to claim 15, wherein the ions implanted when forming the lightly doped drain regions are inert gas ions selected from a group consisting of nitrogen ions ($N^+$) and argon ions ($Ar^+$).

25. The method according to claim 15, wherein the spacers are made of a nitride film and have a thickness of 100 Å or more.

26. The method according to claim 15, wherein the spacers are made of an oxide film and have a thickness of 300 Å or more.

27. The method according to claim 15, wherein the source and drain regions each have a thickness difference of 50 Å or more from the recess channel region.

28. The method according to claim 15, further comprising the step of:
   forming a silicide film on the source and drain regions.

* * * * *